(12) United States Patent
Jung

(10) Patent No.: US 6,519,189 B2
(45) Date of Patent: Feb. 11, 2003

(54) APPARATUS AND A METHOD FOR A DATA OUTPUT CIRCUIT IN A SEMICONDUCTOR MEMORY

(75) Inventor: In Chul Jung, Seoul (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/033,682

(22) Filed: Dec. 27, 2001

(65) Prior Publication Data
US 2002/0086477 A1 Jul. 4, 2002

(30) Foreign Application Priority Data
Dec. 27, 2000 (KR) .................... 2000-0082548

(51) Int. Cl.[7] ............... G11C 7/00; G11C 8/00
(52) U.S. Cl. ............ 365/189.05; 365/193; 365/194; 365/233
(58) Field of Search .......... 365/189.05, 193, 365/194, 233

(56) References Cited

U.S. PATENT DOCUMENTS

| 5,384,735 A | * | 1/1995 | Park et al. .......... 365/233 |
|---|---|---|---|
| 5,715,198 A | * | 2/1998 | Braceras et al. .......... 365/233 |
| 5,835,444 A | * | 11/1998 | Kim et al. .......... 365/233 |
| 6,295,245 B1 | * | 9/2001 | Tomita et al. .......... 365/233 |
| 6,324,119 B1 | * | 11/2001 | Kim .......... 365/233 |
| 6,373,784 B2 | * | 4/2002 | Maeda .......... 365/233 |

* cited by examiner

*Primary Examiner*—Trong Phan
(74) *Attorney, Agent, or Firm*—Marshall, Gerstein & Borun (57) ABSTRACT

A data output circuit and accompanying method for use in a semiconductor memory is disclosed for converting parallel data into serial data and, in particular, for converting the parallel data used in a Double Data Rate Synchronous DRAM (DDR) into serial data. The data output circuit and accompanying method intermediately store a falling data synchronized with a rising edge of one clock for a predetermined time period up to a next rising edge. Final data is merged in response to the stored falling data, thereby preventing failure between the data and ensuring a wide frequency range. Accordingly, the data output circuit and the method may be applied to all kinds of DDR products to prevent data failures therein.

14 Claims, 11 Drawing Sheets

APPARATUS AND A METHOD FOR A DATA OUTPUT CIRCUIT IN A SEMICONDUCTOR MEMORY

BACKGROUND OF THE INVENTION

1. Field of the Invention

The disclosed apparatus and method relate to a data output circuit in a semiconductor memory and, more specifically, to a data output circuit, which is synchronized with a rising edge of a clock, that intermediately stores falling data up to next rising edge and merges final data based upon the stored falling data, thereby preventing failure among data and ensuring a wide range of operating frequency.

2. Description of the Related Art

A double data rate synchronous DRAM (hereinafter referred to as 'DDR') outputs two data for one period of the clock, while a conventional synchronous DRAM (hereinafter referred to as 'SDRAM') outputs only one data for one period. The DDR stores twice as much data as the conventional DRAM in parallel, and the stored data are arrayed in series in a following specific step. As a result, it is possible to output twice as much data as the conventional DRAM.

A circuit for converting parallel-data into serial data is called a data merging circuit. A conventional data output circuit for merging data is as shown in FIG. 1.

Figure 1:
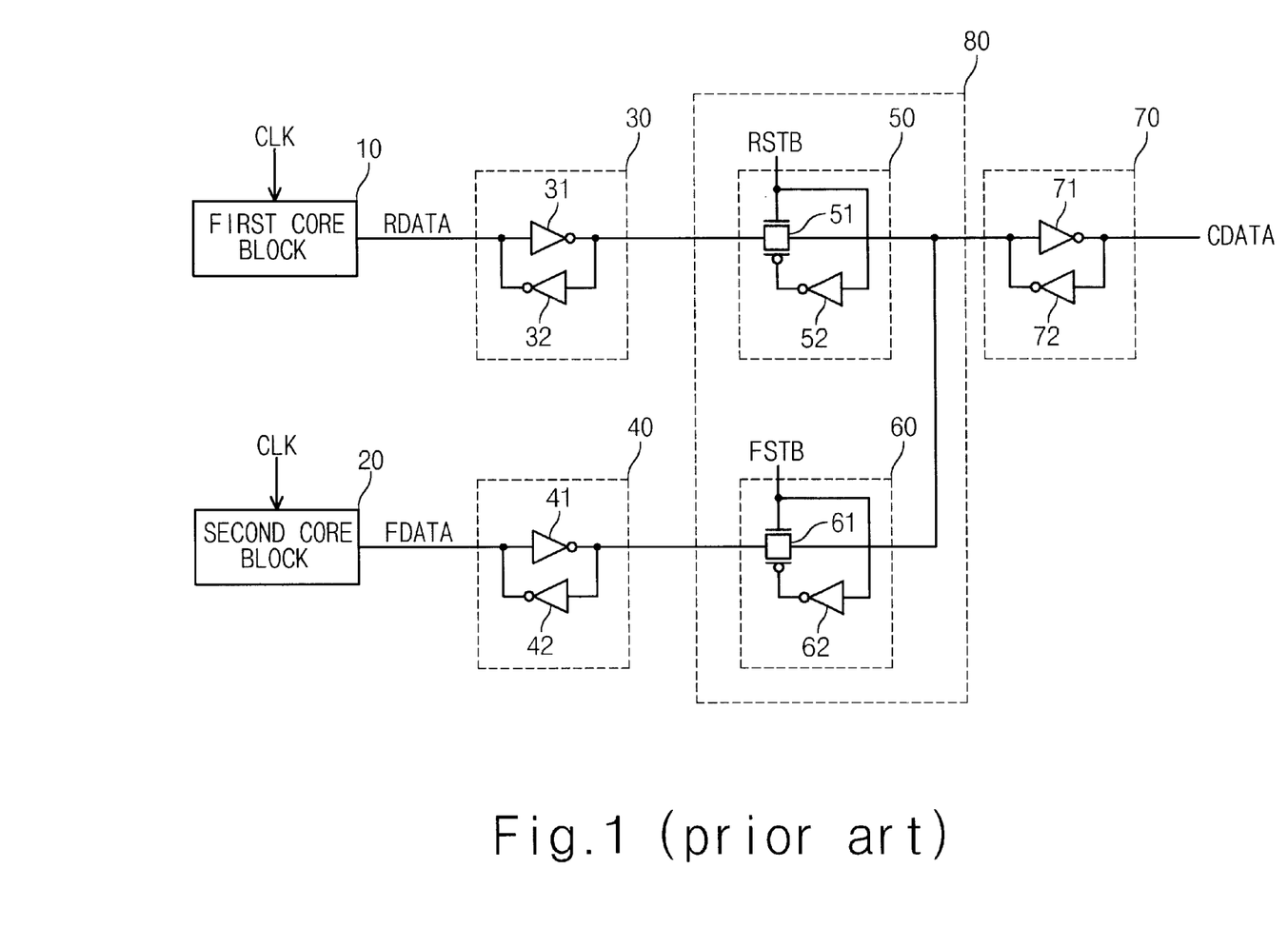
FIG. 1 is a circuit diagram of a conventional output circuit of the related art.

Referring to FIG. 1, when a clock CLK is inputted, a first core block 10 outputs rising data RDATA that is synchronized with a rising time point of the clock CLK and a second core block 20 outputs falling data FDATA that is synchronized with a falling time point of the clock CLK. The two data RDATA and FDATA are transferred to and stored in a rising data latch 30 and a falling data latch 40, respectively. The rising data latch 30 has inverters 31 and 32 to latch the data RDATA, and the falling data latch 40 has inverters 41 and 42 to latch the data FDATA. The rising data latch 30 and the falling data latch 40 latch the data RDATA and FDATA until a rising strobe switch 50 and a failing data strobe switch 60 are turned on.

Next, the data RDATA and FDATA from the rising data latch 30 and the falling data latch 40 are inputted to a data merging block 80. The data merging block 80 comprises the rising data strobe switch 50 and the falling data strobe switch 60. The rising data strobe switch 50 includes a transfer gate 51 and an inverter 52, and the falling data strobe switch 60 includes a transfer gate 61 and an inverter 62. The rising data strobe switch 50 allows the data stored in the rising data latch 30 to pass through a merged data latch 70 having inverters 71, 72 when a rising data strobe signal RSTB is enabled. Also, the falling data strobe switch 60 allows the data stored in the falling data latch 40 to pass through a merged data latch 70 when a falling data strobe signal FSTB is enabled. In this case, the rising data strobe signal RSTB is generated as synchronized with the rising edge of the clock CLK, and the falling data strobe signal FSTB is generated as synchronized with the falling edge of the clock CLK.

Figure 2:
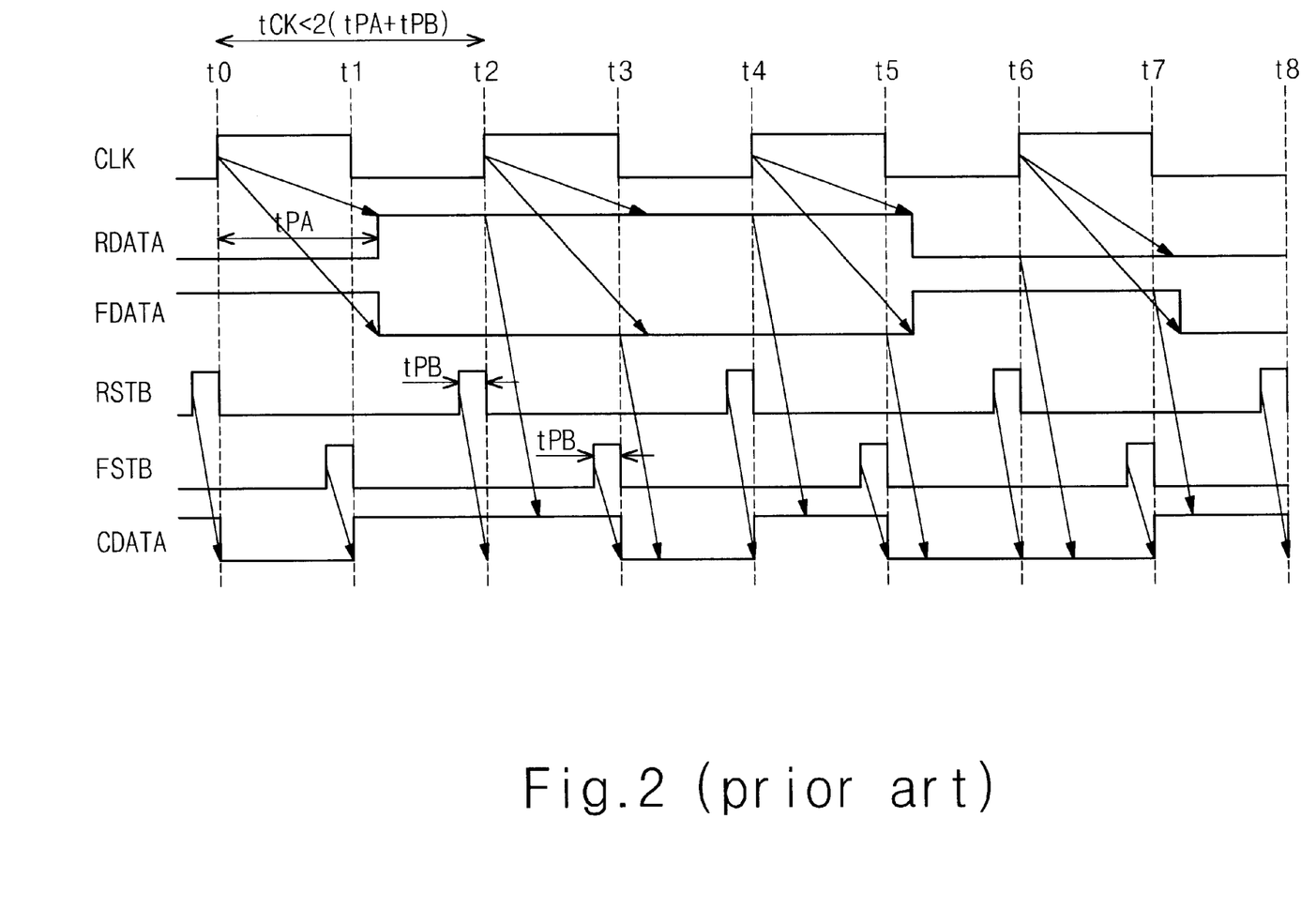
FIGS. 2 and 3 show operation timings and a graph of the conventional data output circuit.

In a common DDR product, a Delay Locked Loop (DLL) circuit is used to generate the rising data strobe signal RSTB before a predetermined time interval tPB starting at the rising edge of the clock CLK and to generate the falling data strobe signal FSTB before the predetermined time interval tPB starting at the falling edge of the clock CLK. As shown in FIG. 2, the rising data strobe signal RSTB and the falling data strobe signals FSTB have the pulse widths that are substantially identical to tPB.

Also, the merged data latch 70 stores a data merged signal CDATA, which is merged in series through the above-described operations of the rising data strobe switch 50 and the falling data strobe switch 60 of the data merging block 80.

An operation process of the conventional data output circuit as configured above will be described with reference to FIGS. 2 and 3.

The first core block 10 and the second core block 20 each output the rising data RDATA and the falling data FDATA at a predetermined time interval tPA starting at a rising edge time point t0 of the clock CLK. The outputted RDATA and FDATA are respectively stored in the rising data latch 30 and the falling data latch 40. In this case, the rising data latch 30 maintains the stored signal until the rising data strobe signal RSTB is enabled, and the falling data latch 40 maintains the stored signal until the falling data strobe signal FSTB is enabled.

The rising data strobe signal RSTB is enabled at the time interval tPB ending at a time point t2. At this time, the rising data strobe switch 50 is turned on and then the rising data RDATA stored in the rising data latch 30 is outputted into the merged data latch 70. The merged data latch 70 outputs the final data merged signal CDTA of a logic high level, based upon the rising data RDATA.

When the falling data strobe signal FSTB is enabled at the time interval tPB ending at a time point t3, the falling data strobe switch 50 is turned on, thereby outputting the falling data FDATA stored in the falling data latch 40 into the merged data latch 70. The merged data latch 70 outputs the final data merged signal CDATA of a logic low level, based upon the falling data FDATA.

As a result, the parallel data RDATA and FDATA are produced in the first and second core blocks 10 and 20, as synchronized with the rising edges of the clock CLK such as the time points t0 and t2, whereas the data merged signal CDATA is generated from the merged data latch 70, as synchronized with both of rising and falling edges of the clock CLK such as time points t2, t3, t4 and t5.

Like this, the data RDATA and FDATA which were respectively produced in parallel in the first and second core blocks 10 and 20 are merged to be the serial data merged signal CDATA, accordingly enabling the operation at a double data rate.

Figure 3:
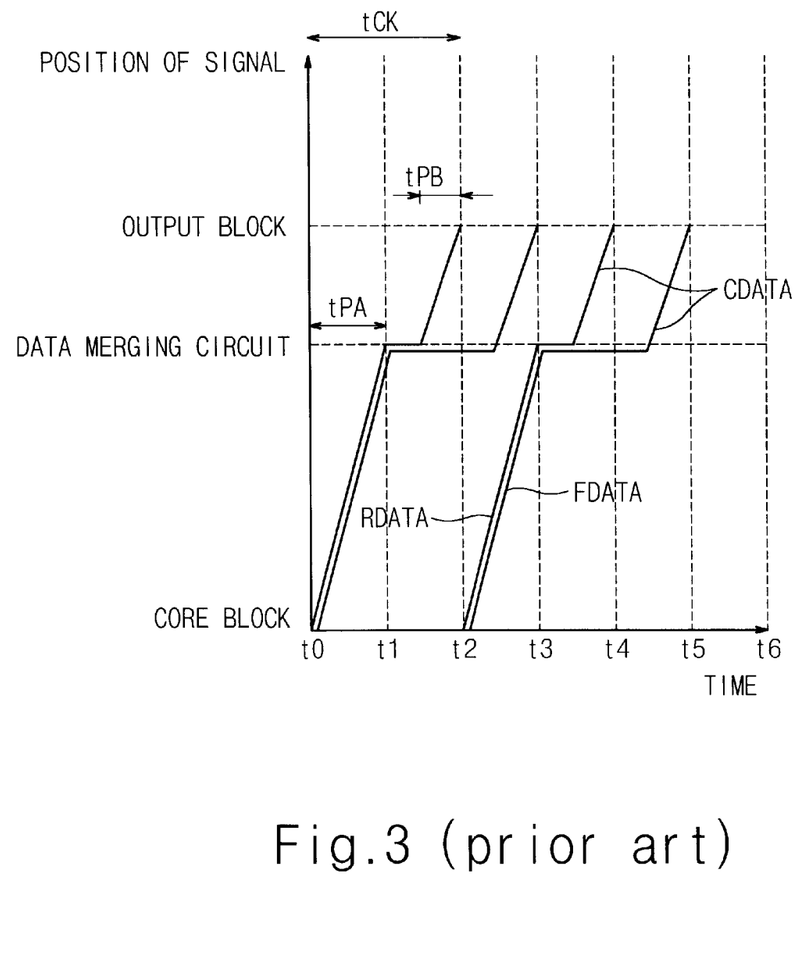

FIG. 3 illustrates the data flow related to the times and signals occurring in the above-described operation.

The rising data RDATA and the falling data FDATA generated by the first and second core blocks 10 and 20 at the rising edge of the clock CLK are outputted into the data merging block 80 after the time tPA. These data RDATA and FDATA are respectively latched by the rising data latch 30 and the falling data latch 40. With a delay of the time tPB, data RDATA and FDATA are outputted as the data merged signal CDATA by the merged data latch 70.

In case that one period tCK of the clock CLK is smaller than the fixed delay times tPA and tPB, the conventional data output circuit has no problem in data transmission and mergence as shown in the timings of FIG. 2. However, if the one period tCK is larger by a large margin than the fixed delay times tPA and tPB, there is a problem that data failure may take place as shown in timings of FIG. 4 and a graph of FIG. 5.

Figure 4:
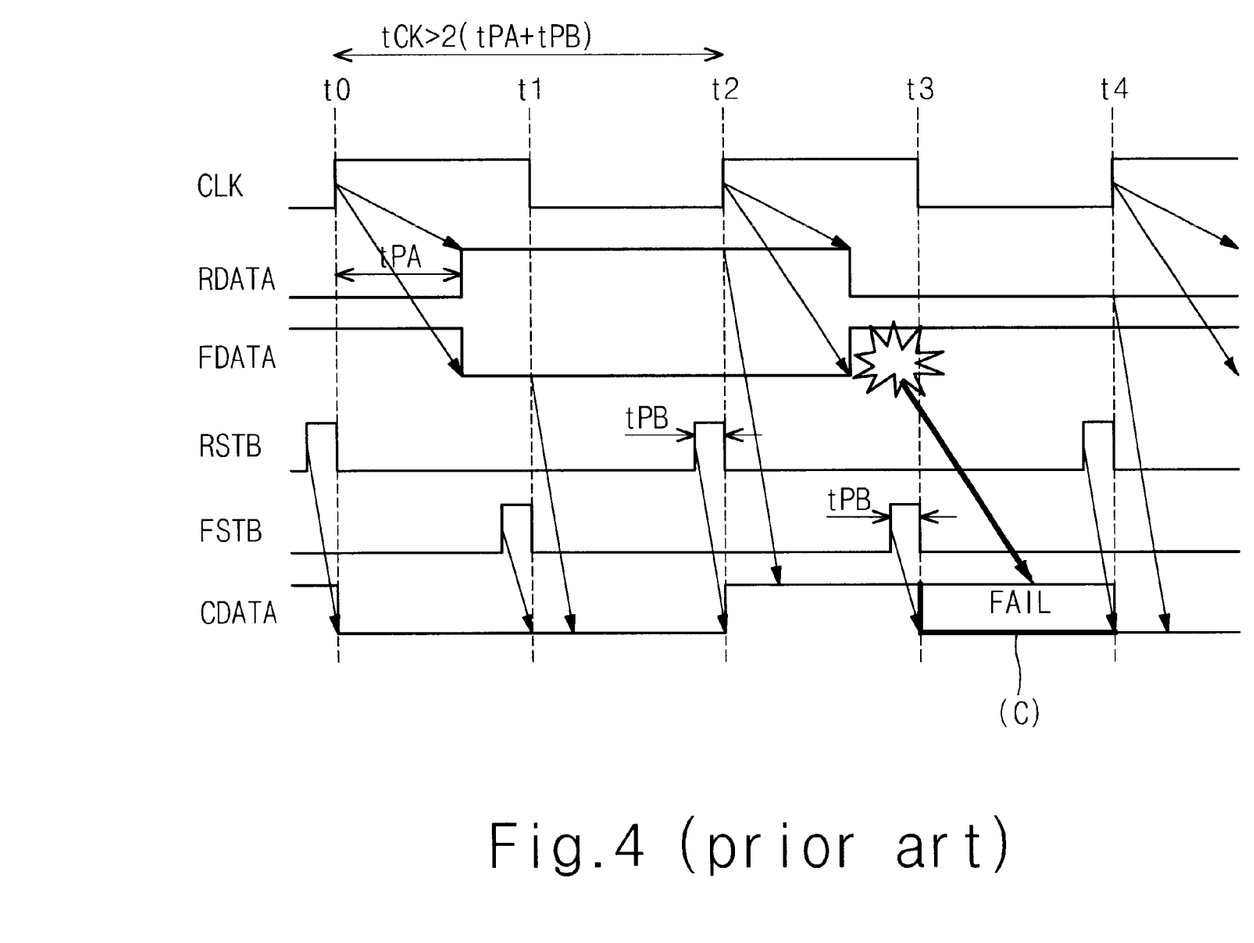
FIGS. 4 and 5 show operation timings and a graph for illustrating data failure in the conventional data output circuit.
Figure 5:
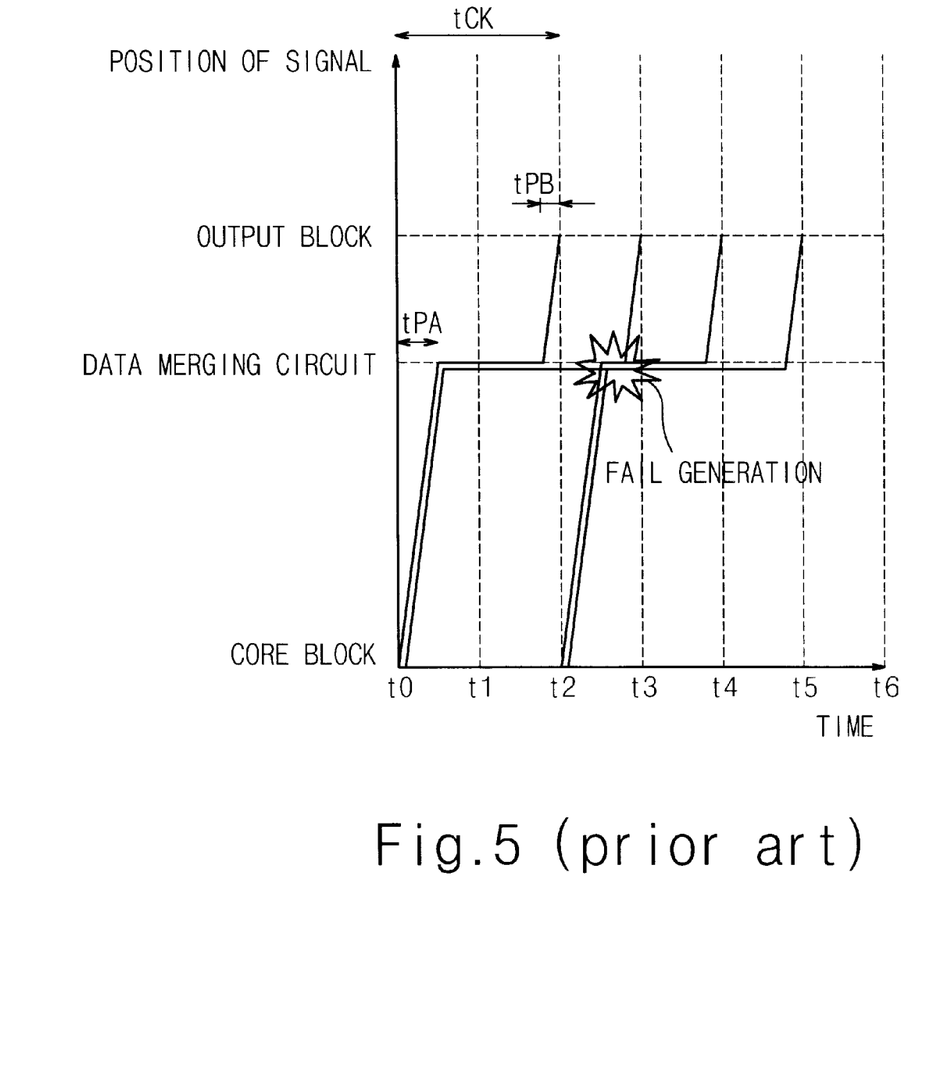

Referring to FIGS. 4 and 5, if the falling data strobe switch 60 is turned on, new data is input into the falling data latch 40 at the time point t3 when the falling data FDATA stored in the falling data latch 40 is not yet outputted into the merged data latch 70. Accordingly, the previously stored falling data (C) disappears resulting in data failure.

Correlation between the period tCK of the clock signal and data failure is described in detail as follows.

The first data generated from the second core block 20 is stored in the falling data latch 40 up to activation of the falling data strobe signal FSTB. Here, FSTB is activated after a time of 1.5 tCK–tPB starting at the generation of the first data from the second core block 20. Also, the second data is generated from the second block 20, and then transferred into the falling data latch 40 after a time of tCK+tPA starting at the generation of the first data. Further, since the second new data should be inputted after the first data is outputted to the merged data latch 70, an equation is realized as follows:

$$1.5 tCK - tPB < tCK + tPA \qquad (1)$$

Equation 1 is arranged about tCK as follows:

$$tCK < 2(tPA + tPB) \qquad (2)$$

In other words, one period tCK of the clock CLK is necessarily smaller than 2(tPA+tPB) in order to avoid generation of failed data and, thus, there is an upper limit of tCK due to the features of the data merging circuit. As a result, the conventional data output circuit may not operate normally in a low frequency range and, thus, a product employing the circuit has a heavy restriction in performance.

SUMMARY OF THE INVENTION

Accordingly, the disclosed device and method have been proposed to solve the foregoing problems.

The disclosed device and method provide a data output circuit in a semiconductor memory that intermediately stores falling data that is synchronized with a rising edge of a clock up to the next rising edge and merges final data based upon the stored falling data. As a result, it is possible to prevent failure between data and to ensure a wide frequency range.

According to the teachings of the disclosed device, there is provided a data output circuit in a semiconductor memory having a rising data latch for latching a rising data that is inputted in synchronization with a clock. Further included is a falling data latch for latching a falling data that is inputted in synchronization with the clock. A rising data strobe switch is included for outputting the rising data in synchronization with a rising edge of the clock into an output node in response to a rising data strobe signal. A delay means delays the failing data for a predetermined time period in response to the rising data strobe signal. Finally, a first falling data strobe switch is included for outputting the delayed falling data, as synchronized with a falling edge of the clock into the output node, in response to a falling data strobe signal.

According to the teachings of the disclosed device, there is provided a data output circuit in a semiconductor memory having a rising data latch for latching a rising data that is inputted in synchronization with a clock. Further included is a falling data latch for latching a falling data that is inputted in synchronization with the clock. A rising data strobe switch is included for outputting the rising data in synchronization with a rising edge of the clock into an output node in response to a rising data strobe signal. A delay means or delay circuit delays the falling data for a predetermined time period in response to the rising data strobe signal. Finally, a first falling data strobe switch is included for outputting the delayed falling data, as synchronized with a falling edge of the clock into the output node, in response to a falling data strobe signal.

DESCRIPTION OF THE PREFERRED EMBODIMENTS

An embodiment of the disclosed apparatus will be described in reference to FIG. 6. When a clock CLK is inputted, the first core block 10 outputs a rising data RDATA synchronized with a rising edge of the clock CLK, and the second core block 20 outputs a falling data FDATA synchronized with a falling edge, wherein the falling data FDATA and the rising data RDATA are generated in parallel. The rising data RDATA from the first core block 10 is transferred and stored into a rising data latch 30, and the falling FDATA from the second core block 20 is transferred and stored into a falling data latch 40. The rising data latch 30 has inverters 31 and 32 to latch the data RDATA for a predetermined time period, and the falling data latch 40 has inverters 41 and 42 to latch the data FDATA for another predetermined time period.

The two data RDATA and FDATA from the rising and falling data latches 30 and 40 are next inputted to a data-merging block 150. The data-merging block 150 comprises a rising data strobe switch 100, a falling data strobe switch 110, a falling data intermediate storage 120 and a falling data strobe switch 130.

The rising data strobe switch 100 outputs the rising data RDATA from the rising data latch 30 into a merged data latch 140 having inverters 141,142 in synchronization with the rising edge of the clock CLK in response to a rising data strobe signal RSTB. Here, the rising data strobe switch 100 includes a transfer gate 101 comprised of a PMOS transistor and an NMOS transistor. The rising data strobe signal RSTB is applied to a gate of the NMOS transistor, as synchronized with the rising edge of the clock CLK. An inverted signal by an inverter 102 of the rising data strobe signal RSTB is applied to a gate of the PMOS transistor.

The first or input falling data strobe switch 110 includes a transfer gate 111 comprised of a paired PMOS transistor and NMOS transistor. The rising data strobe signal RSTB is applied to a gate of the PMOS transistor. The inverted signal of the rising data strobe signal RSTB is applied to a gate of the NMOS transistor. The first or input falling data strobe switch 110 outputs the falling data FDATA from the falling data latch 40 into the falling data intermediate storage 120, in synchronization with the rising edge of the clock CLK, in response to the rising data strobe signal RSTB. The falling data intermediate storage 120, along with the output falling data strobe switch 130, form a delay circuit to prevent data failure between falling data of consecutive clock CLK periods as discussed below. The delay circuit delays the falling data for a predetermined period of time.

The falling data intermediate storage 120 for storing the falling data FDATA from the first or input falling data strobe switch 110 includes a latch comprised of inverters 121 and 122, and an inverter 123 for inverting a signal from the latch. The falling data intermediate storage 120 is connected in series between the first or input falling data strobe switch 110 and the falling data strobe switch 130. The falling data intermediate storage 120 stores a falling data F_LAT until the falling data F_LAT is outputted into the merged data latch 140.

Further, the second or output falling data strobe switch 130 outputs the falling data F_LAT of the falling data intermediate storage 120 into the merged data latch 140, in synchronization with the falling edge of the clock CLK, in response to the falling data strobe signal FSTB. Here, the second or output falling data strobe switch 130 includes a transfer gate 131 comprised of a paired PMOS transistor and NMOS transistor. The falling data strobe signal FSTB is applied to a gate of the NMOS transistor. An inverted signal supplied by the inverter 132 of the falling data strobe signal FSTB is applied to a gate of the PMOS transistor.

Further, the parallel data are merged into serial data in a common output node of the rising data strobe switch 100 and the output falling data strobe switch 130. The merged data are stored in the merged data latch 140.

The operation of the data output circuit shown in FIG. 6 will now be described for two situations as follows.

A situation in which the rising data strobe signal RSTB has a pulse width smaller than tPA+tPB will be described with reference to FIGS. 7 and 8.

The rising strobe switch 100 is first turned on in response to the activation of the RSTB. The rising data RDATA stored in the rising data latch 30 is then outputted into the merged data latch 140. At a time point t2 when the rising data strobe signal RSTB is enabled, a data merged signal CDATA maintains a logic high level, based on the level of the rising data RDATA. The input falling data strobe switch 1 10 outputs the falling data FDATA of the falling data latch 40 into the falling data intermediate storage 120 in response to the activation of RSTB. At the same time, when the rising data strobe signal RSTB is enabled, the input falling data strobe switch 110 is turned on. The falling data intermediate storage 120 stores the falling data FDATA until the output falling data strobe switch 130 is turned on. In this case, the data RDATA and FDATA are respectively latched in the rising data strobe switch 100 and the intermediate storage 120 and the data RDATA and FDATA generated at the next period of clock CLK are respectively stored in the rising data latch 30 and the falling data latch 40, resultantly avoiding data collision.

Figure 7:
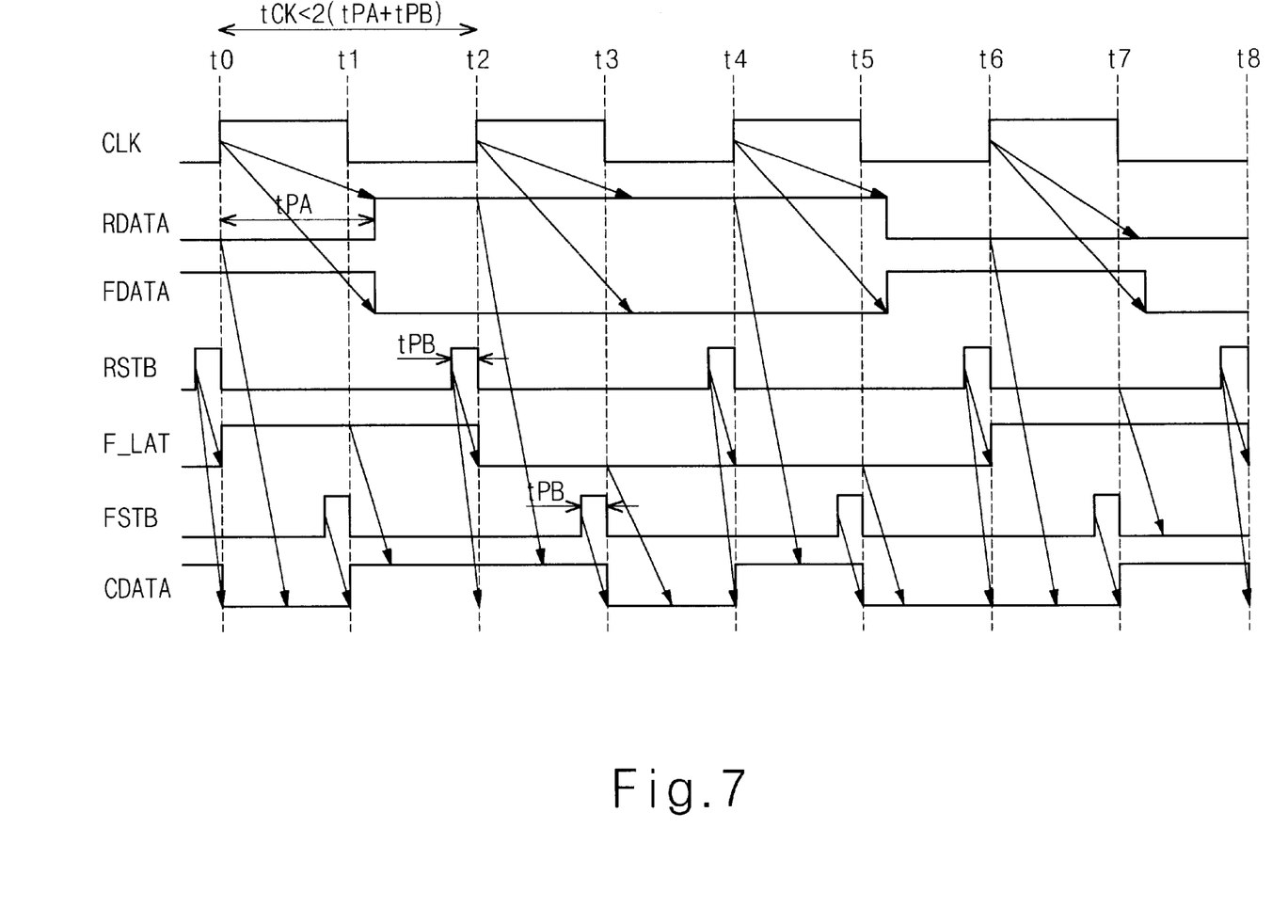
FIGS. 7 and 8 show operation timings and a graph in which a rising data strobe signal has a pulse width smaller than the sum of tPA and tPB, according to the first embodiment of the disclosed device and method.
Figure 8:
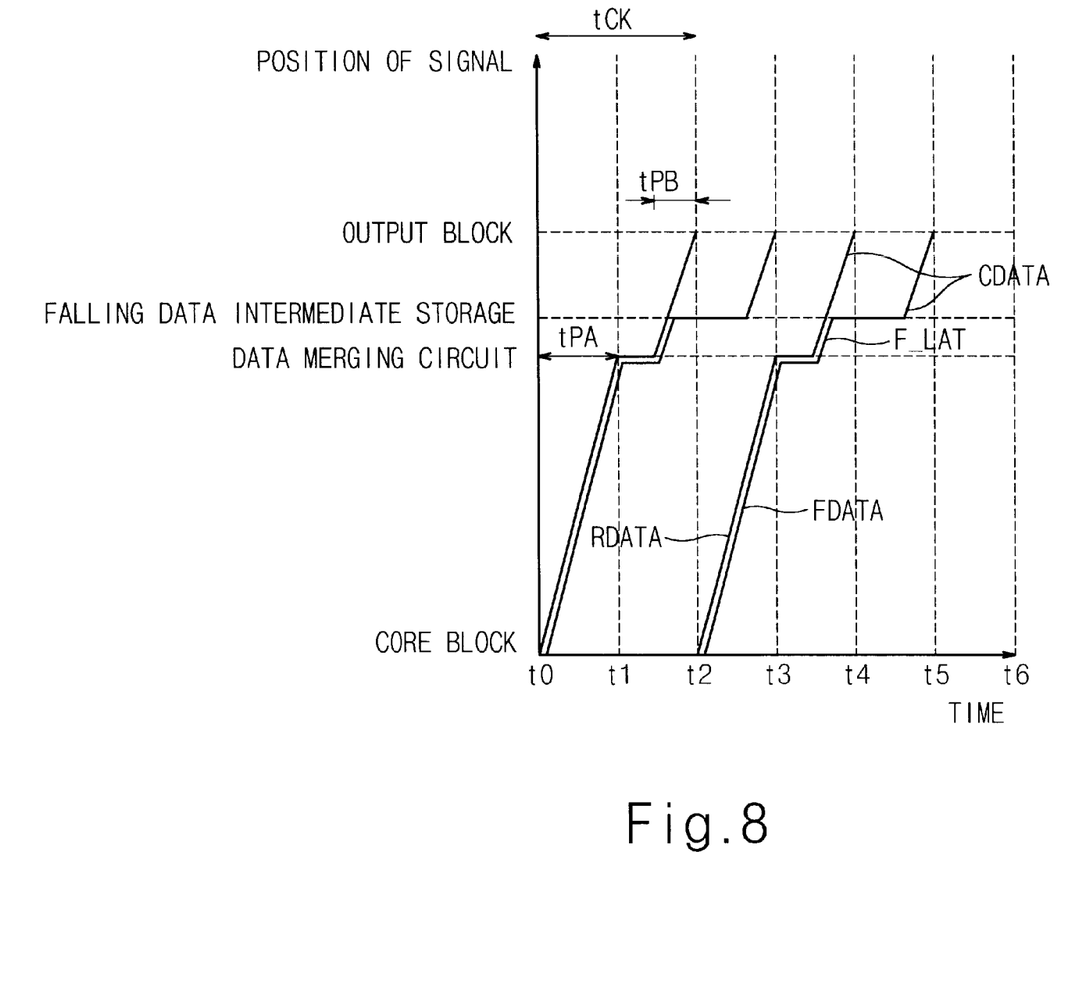

In other words, the first falling data FDATA is outputted into the falling data intermediate storage 120 and the second falling data is inputted into the falling data latch 40, at the same rising edge of the clock CLK as seen in FIGS. 7 and 8. As a result, if the rising data strobe signal RSTB has a pulse width smaller than tPA+tPB, it is possible to avoid collision between the two falling data as in the conventional data merging circuit.

Meanwhile, the first falling data FDATA stored in the falling data intermediate storage 120 should be outputted to the merged data latch 140 the second falling data FDATA is outputted into the falling data latch 40. Therefor, the output falling data strobe switch 130 is turned on in response to the activation of FSTB. Next, the falling data FSTB stored in the falling data intermediate storage 120 is outputted into the merged data latch 140. At the time point t3, when the falling data strobe signal FSTB is enabled the data merged signal CDATA transits from high to low in response to the level of the F_LAT of the falling data intermediate storage 120.

As a result, as shown in FIGS. 7 and 8, if the pulse width of the rising strobe signal RSTB is made smaller than tPA+tPB, such that the rising data strobe signal RSTB can not continuously pass the first data and the second data, an upper limit of the period tCK does not exist as in the conventional circuit.

Figure 9:
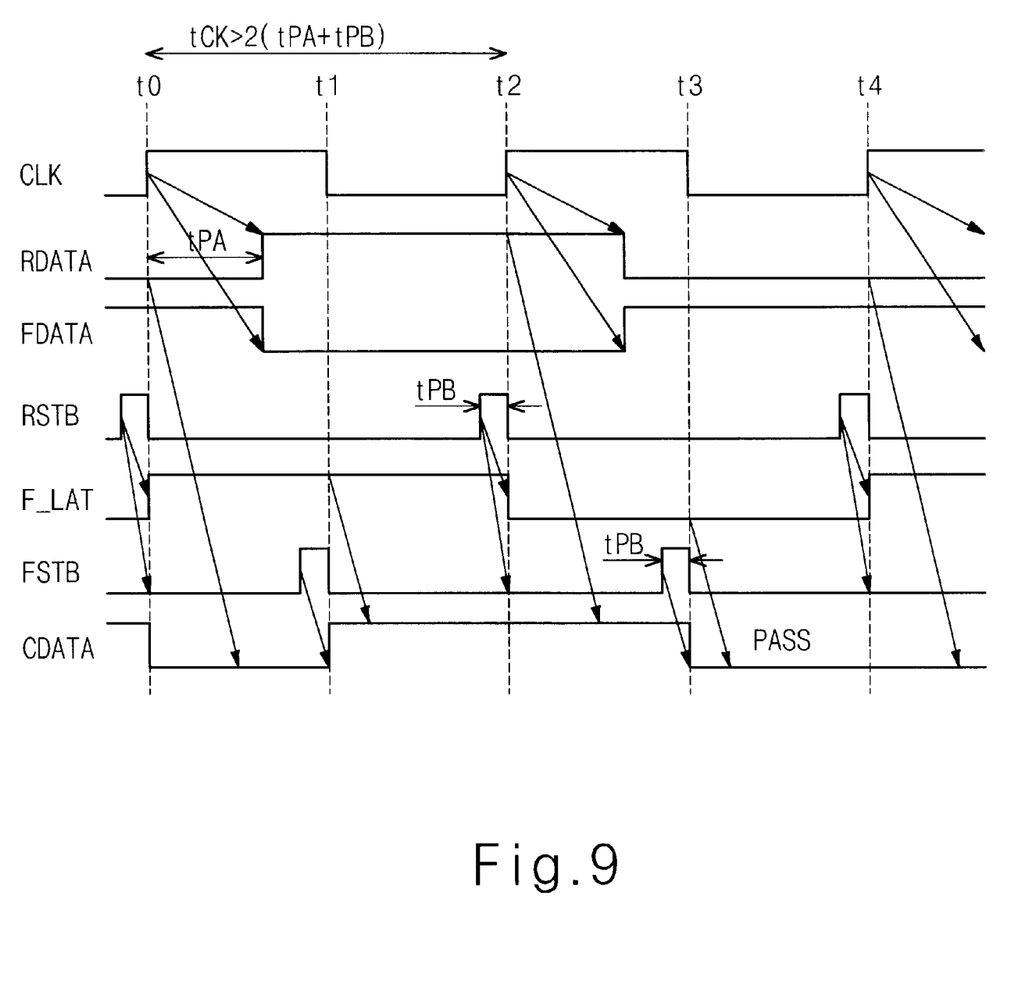
FIGS. 9 and 10 show operation timings and a graph in which a rising data strobe signal has a pulse width larger than the sum of tPA and tPB, according to the first embodiment of the disclosed method and apparatus.
Figure 10:
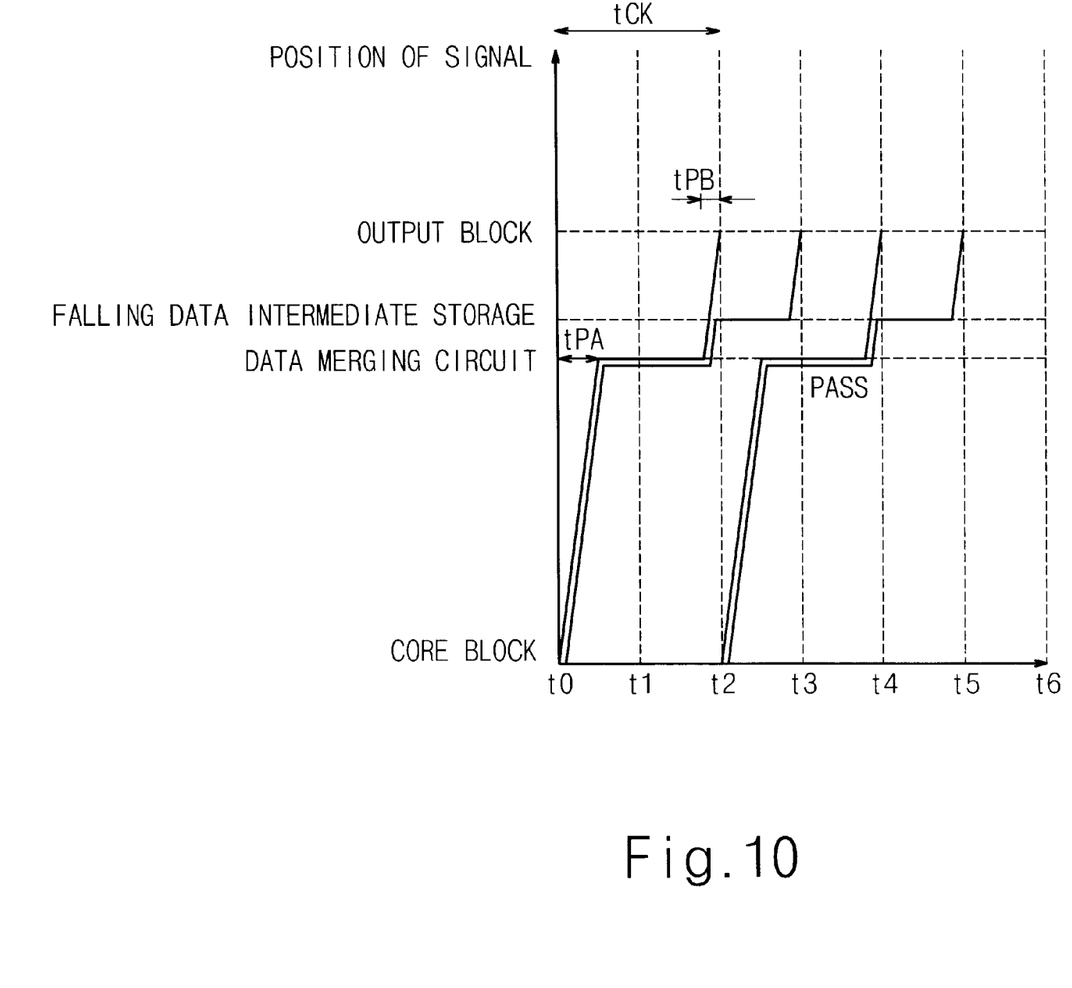

A situation in which the rising data strobe signal RSTB has a pulse width larger than tPA+tPB will be described with reference to FIG. 9 and FIG. 10.

The input falling data strobe switch 110 is turned on in response to the activation of the rising data strobe signal RSTB. Next, the falling data intermediated storage 120 stores the falling data FDATA from the falling data latch 40 for a predetermined time period until the second falling data is inputted. Also, at time point t2 when the falling data strobe signal FSTB is enabled, the output falling data strobe switch 130 is turned on, and then the data merged signal CDATA is outputted based on the falling data F_LAT from the intermediate storage 120. Thus, it is possible to avoid data failure.

In other words, the first falling data FDATA from the falling data latch 40 is latched to the intermediate storage 120 and the second falling data FDATA generated at the second period of the clock CLK is inputted into the falling data latch 40 in response to the activation of the rising data strobe signal RSTB. As a result, data failure does not take place between the falling data of the first period and the next period of the clock CLK.

According to the disclosed method and apparatus as described above, data can be output as merged data regardless of periods of time tPA+tPB and tCK of the clock CLK, thereby preventing data failure.

Figure 11:
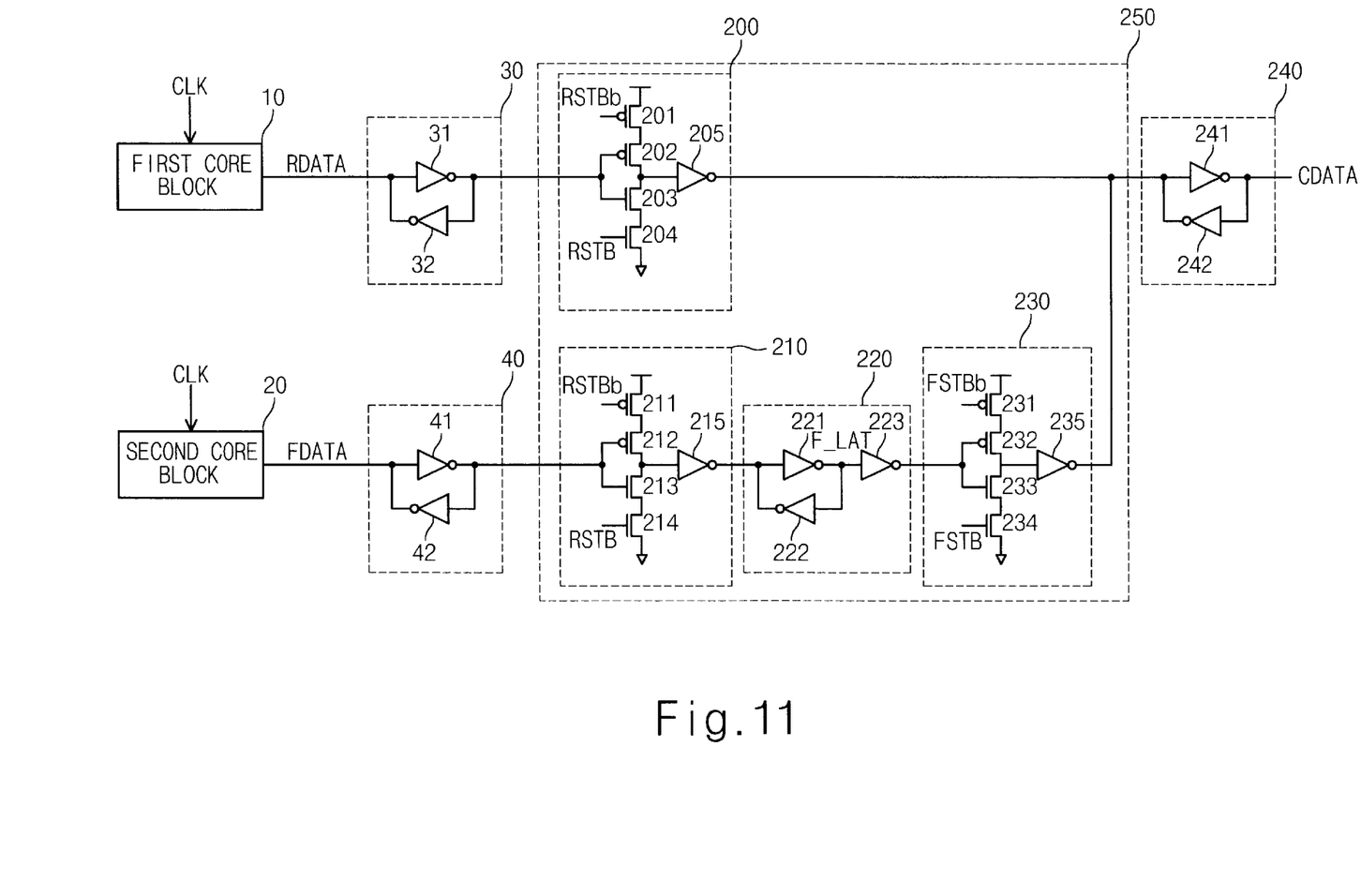
FIG. 11 is a circuit diagram of a data output circuit in a semiconductor memory according to a second embodiment of the disclosed method and apparatus.

FIG. 11 shows a data output circuit in a semiconductor memory according to another embodiment of the disclosed method and apparatus.

A rising data strobe switch 200 of a data merging block 250 outputs the rising data RDATA from the rising data latch 30 into a merged data latch 240 having inverters 241, 242. The rising data strobe switch 200 includes PMOS transistors 201 and 202 and NMOS transistors 203 and 204 connected in series between a power voltage terminal and a ground voltage terminal. A rising data strobe signal RSTB is applied to a gate terminal of the NMOS transistor 204 while a inverted signal RSTBb of the rising data strobe signal RSTB is applied to a gate terminal of the PMOS transistor 201. The PMOS transistor 202 and the NMOS transistor 203 performs an inverting function only when the rising data strobe signal RSTB and the inverted signal RSTBb are enabled. The PMOS transistor 202 and the NMOS transistor 203 have a common drain terminal, which is connected to an inverter 205.

Also, the input falling data strobe switch 210 includes PMOS transistors 211 and 212 and NMOS transistors 213 and 214 connected in series between the power voltage terminal and the ground voltage terminal. The rising data strobe signal RSTB is applied to a gate terminal of the NMOS transistor 214 while a inverted signal RSTBb of the rising data strobe signal RSTB is applied to a gate terminal of the PMOS transistor 211. The PMOS transistor 212 and the NMOS transistor 213 perform an inverting function only when the rising data strobe signal RSTB and the inverted signal RSTBb are enabled. The PMOS transistor 212 and the NMOS transistor 213 have a common drain terminal, which is connected to an inverter 215.

Further, an output falling data strobe switch 230 includes PMOS transistors 231 and 232 and NMOS transistors 233 and 234 connected in series between the power voltage terminal and the ground voltage terminal. A falling data strobe signal FSTB is applied to a gate terminal of the NMOS transistor 234 while a inverted signal FSTBb of the falling data strobe signal FSTB is applied to a gate terminal of the PMOS transistor 231. The PMOS transistor 232 and the NMOS transistor 233 performs an inverting function only when the falling data strobe signal FSTP and th,e inverted signal FSTBb are enabled. The PMOS transistor 232 and the NMOS transistor 233 have a common drain terminal and it is connected to an inverter 235.

Figure 6:
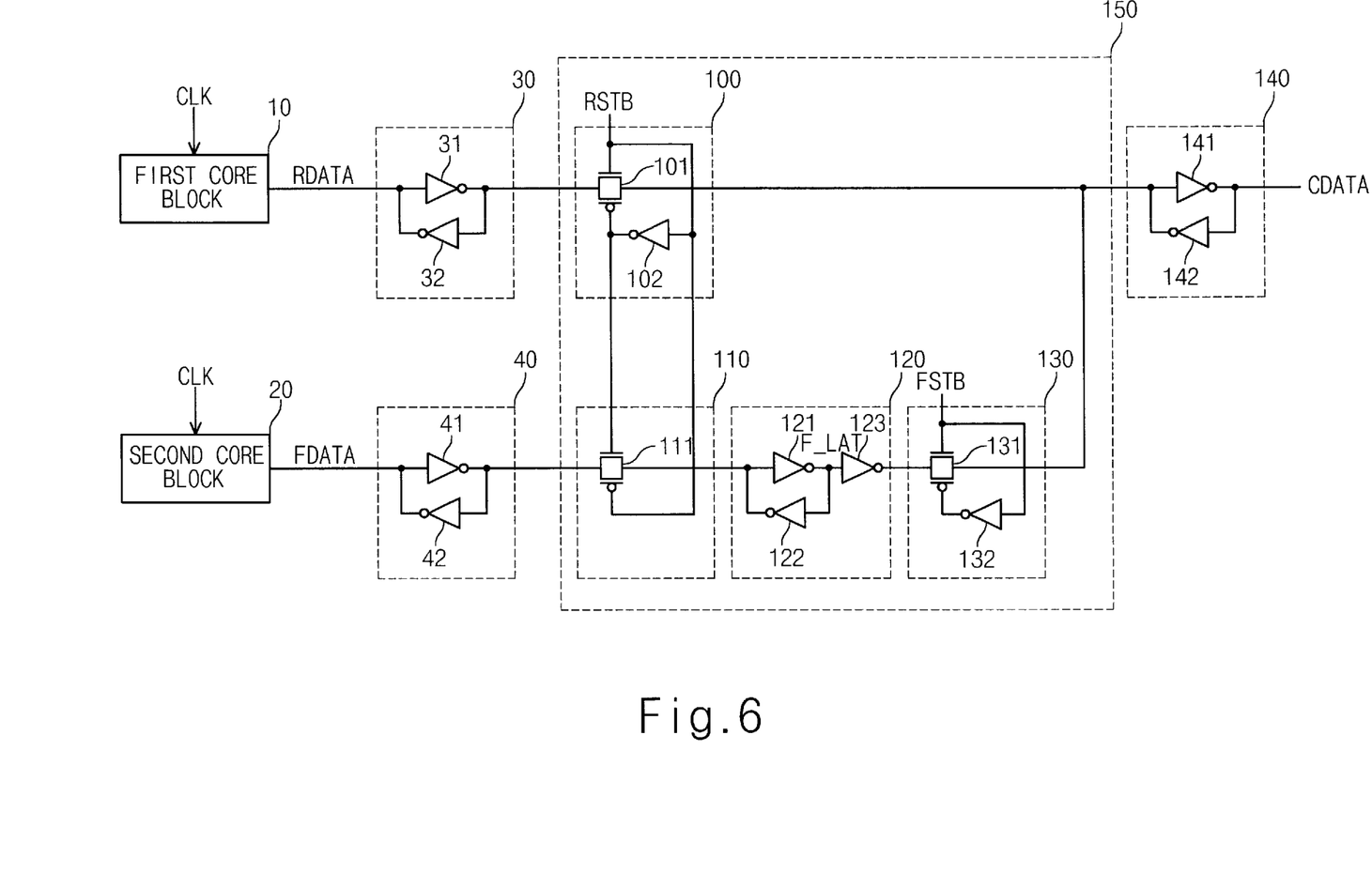
FIG. 6 is a circuit diagram of an output circuit in a semiconductor memory according to a first embodiment of the disclosed device and method.

The data output circuit of the semiconductor memory having the foregoing configuration has operation processes that are the same as the circuit shown in FIG. 6, in which the data can be outputted as merged data regardless of the periods of time tPA+tPB and tCK of the clock CLK, thereby preventing data failure.

While the teachings of the invention have been explained with respect to particular examples, it will be apparent to those of ordinary skill in the art that the scope of this patent is not limited to those examples. On the contrary, this patent covers all apparatuses and methods falling within the spirit and scope of the appended claims, either literally or under the doctrine of equivalents.

What is claimed is:

1. A data output circuit in semiconductor memory, comprising:
    a rising data latch configured for latching a rising data which is inputted in synchronization with a clock;
    a falling data latch configured for latching a falling data which is inputted in synchronization with the clock;
    a rising data strobe switch configured to output the rising data into an output node in synchronization with a rising edge of the clock;
    a delay circuit configured for selectively latching the falling data in synchronization with a rising edge of the clock; and
    an output falling data strobe switch configured for outputting the falling data latched by the delay circuit into the output node in synchronization with a falling edge of the clock.

2. The data output circuit according to claim 1, wherein said rising data strobe switch comprises:
    a first transfer gate for receiving the rising data strobe signal via an NMOS transistor and an inverted rising data strobe signal via a PMOS transistor; and
    a first inverter for inverting the rising data strobe signal and outputting the inverted rising data strobe signal into said PMOS transistor.

3. The data output circuit according to claim 1, wherein said rising data strobe switch comprises:
    a second inverter comprised of an NMOS transistor and a PMOS transistor connected in series between a power-voltage terminal and a ground-voltage terminal, the second inverter configured to invert the data from said rising data latch in response to the rising data strobe signal; and
    a third inverter configured for inverting an output data from said second inverter.

4. The data output circuit according to claim 1, wherein said delay circuit comprises:
    an input falling data strobe switch configured for outputting the falling data latched by said falling data latch in synchronization with the rising edge of the clock; and
    a falling data intermediate storage configured for latching the falling data outputted from said input falling data strobe switch for a predetermined time period up to a next rising edge of the clock.

5. The data output circuit according to claim 4, wherein said input falling data strobe switch comprises:
    a fourth inverter comprised of a PMOS transistor and an NMOS transistor connected between a power voltage terminal and a ground voltage terminal, the fourth inverter configured for inverting the data from said falling data latch in response to the rising data strobe signal; and
    a fifth inverter configured for inverting an output data from said fourth inverter.

6. The data output circuit according to claim 5, wherein output first falling data strobe switch comprises:
    a sixth inverter comprised of a PMOS transistor and an NMOS transistor connected between the power voltage terminal and the ground voltage terminal, the sixth inverter configured to invert the data from said falling data intermediate storage in response to the rising data strobe signal; and
    a seventh inverter configured for inverting an output data from said sixth inverter.

7. The data output circuit according to claim 4, wherein said falling data intermediate storage comprises:
    a latch with two inverters; and
    an eighth inverter configured for inverting an output data from said latch, wherein an input signal is output as a non-inverted signal.

8. The data output circuit according to claim 4, wherein said output falling data strobe switch comprises:
    a ninth inverter comprised of a PMOS transistor and an NMOS transistor connected between the power voltage terminal and the ground voltage terminal, the ninth inverter configured to invert the falling data latched by said falling data intermediate storage in response to the rising data strobe signal; and
    a tenth inverter configured for inverting the falling data outputted from said ninth inverter.

9. The data output circuit according to claim 4, wherein said rising data strobe switch and said input falling data strobe switch are simultaneously turned one of on and off in response to the rising data strobe signal.

10. The data output circuit according to claim 4, wherein said input falling data strobe switch comprises a second transfer gate for receiving the rising data strobe signal via a PMOS transistor and an inverted signal of the rising data strobe signal inverted via an NMOS transistor.

11. The data output circuit according to claim 9, wherein said input falling data strobe switch comprises a second transfer gate for receiving the rising data strobe signal via a PMOS transistor and an inverted signal of the rising data strobe signal that is inverted via an NMOS transistor.

12. The data output circuit according to claim 1, wherein said first falling data strobe switch comprises:
   a third transfer gate configured for receiving the failing data strobe signal via an NMOS transistor and for receiving an inverted signal of the falling data strobe signal via a PMOS transistor; and
   an eleventh inverter for inverting and outputting the falling data strobe signal to said PMOS.

13. A method of outputting data in a semiconductor memory, said method comprising:
   (a) outputting a rising data in synchronization with a rising edge of an external clock signal;
   (b) latching a falling data in synchronization with the rising edge of an external clock signal; and
   (c) outputting the latched falling data in synchronization with a falling edge of the external clock signal.

14. The method of outputting data in a semiconductor memory according to claim 13, wherein latching of the falling data results in the falling data being latched until a next rising edge of the external clock signal.

* * * * *

UNITED STATES PATENT AND TRADEMARK OFFICE
CERTIFICATE OF CORRECTION

PATENT NO.    : 6,519,189 B2
DATED         : February 11, 2003
INVENTOR(S)   : In Chul Jung It is certified that error appears in the above-identified patent and that said Letters Patent is hereby corrected as shown below:

Column 9,
Line 8, after "for receiving the" please delete "failing" and insert
-- falling -- in its place.

Signed and Sealed this

Twenty-fifth Day of November, 2003

JAMES E. ROGAN
*Director of the United States Patent and Trademark Office*